(12) United States Patent
Ikeda et al.

(10) Patent No.: US 8,624,284 B2
(45) Date of Patent: Jan. 7, 2014

(54) LIGHT-EMITTING DEVICE AND LIGHTING DEVICE

(75) Inventors: Hisao Ikeda, Kanagawa (JP); Yutaka Uchida, Kanagawa (JP); Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 92 days.

(21) Appl. No.: 13/232,671

(22) Filed: Sep. 14, 2011

(65) Prior Publication Data

US 2012/0061708 A1 Mar. 15, 2012

(30) Foreign Application Priority Data

Sep. 15, 2010 (JP) .................................. 2010-206386

(51) Int. Cl.
*H01L 33/00* (2010.01)
(52) U.S. Cl.
USPC ................. 257/98; 257/79; 257/91; 257/103; 438/22; 438/29; 438/43
(58) Field of Classification Search
None
See application file for complete search history.

(56) References Cited

U.S. PATENT DOCUMENTS

| | | | |
|---|---|---|---|
| 5,962,962 A | 10/1999 | Fujita et al. | |
| 7,112,115 B1 | 9/2006 | Yamazaki et al. | |
| 7,859,627 B2 | 12/2010 | Nishida et al. | |
| 7,977,876 B2 | 7/2011 | Yamazaki et al. | |
| 8,203,157 B2 | 6/2012 | Suzuki et al. | |
| 2004/0007969 A1* | 1/2004 | Lu et al. | 313/501 |
| 2005/0258436 A1 | 11/2005 | Arai | |
| 2008/0129184 A1 | 6/2008 | Nishida et al. | |
| 2008/0129933 A1 | 6/2008 | Nishida et al. | |
| 2008/0130122 A1 | 6/2008 | Egi et al. | |
| 2011/0134647 A1 | 6/2011 | Nishida et al. | |

FOREIGN PATENT DOCUMENTS

| | | |
|---|---|---|
| JP | 2000-182769 | 6/2000 |
| JP | 2007-173424 | 7/2007 |
| WO | WO 2009/119733 A1 | 10/2009 |

OTHER PUBLICATIONS

Reineke, S. et al, "White Organic Light-Emitting Diodes with Fluorescent Tube Efficiency," Nature, vol. 459, May 14, 2009, pp. 234-239.
European Search Report re application No. EP 11181085.9, dated Oct. 25, 2011.

* cited by examiner

*Primary Examiner* — Kyoung Lee
(74) *Attorney, Agent, or Firm* — Husch Blackwell LLP

(57) ABSTRACT

Provided is a light-emitting device having a structure in which a high refractive index component is provided between a solid light-emitting element and air, has an uneven structure on a surface in contact with air, and can be reused. The light-emitting device includes a substrate having a refractive index of 1.6 or higher and a light-transmitting property, a solid light-emitting element including a light-emitting region having a refractive index of 1.6 or higher on one surface of the substrate, and a component having a refractive index of 1.6 or higher and a light-transmitting property on the other surface of the substrate, wherein the component includes an uneven structure on a surface in contact with air and is connected to the substrate via a liquid having a refractive index of 1.6 or higher and a light-transmitting property.

14 Claims, 9 Drawing Sheets

LIGHT-EMITTING DEVICE AND LIGHTING DEVICE

BACKGROUND OF THE INVENTION

1. Field of the Invention

The present invention relates to light-emitting devices and lighting devices each using a solid light-emitting element.

2. Description of the Related Art

In a solid light-emitting element in which light is emitted in a medium having higher refractive index than air, incident light from a high refractive index region to a low refractive index region with an angle larger than the critical angle is fully reflected on an interface. A variety of techniques has been developed in order to extract light of the solid light-emitting element efficiently.

For example, a technique is known in which incident light to a low refractive index region with an angle larger than the critical angle is prevented from being fully reflected repeatedly with the use of a structure in which a high refractive index region is connected to the low refractive index region via an interface that has an uneven structure.

In Non-Patent Document 1, a structure is employed in which a high refractive index glass substrate is combined with a high refractive index lens as a means for increasing light extraction efficiency of a solid light-emitting element.

REFERENCE

Non-Patent Document

[Non-Patent Document 1] "White organic light-emitting diodes with fluorescent tube efficiency", Nature, 14 May 2009, Vol. 459, pp. 234-239

SUMMARY OF THE INVENTION

In order to increase light extraction efficiency of a solid light-emitting element, a high refractive index component that has an uneven structure on a surface in contact with air is preferably provided between the solid light-emitting element and air. In order to realize such a structure, the uneven structure needs to be formed intentionally at an interface in contact with air, and accordingly, the fabrication process of the light-emitting device is complicated.

In addition, the light-emitting element has a function of converting electric energy into optical energy. A reduction in emission efficiency due to the use of the light-emitting element and a degradation phenomenon thereof are difficult to avoid. In contrast, the uneven structure mainly has a function of controlling reflection of light; thus, degradation is less likely to occur than in the light-emitting element. That is, it can be said that the lifetime as a component included in a light-emitting device differs between the solid light-emitting element and the uneven structure that increases the light extraction efficiency thereof.

Therefore, in the case where the uneven structure is formed so as not to be separated from the light-emitting element, when the performance of the light-emitting element becomes low or when the light-emitting element is degraded or broken, the uneven structure would be wasted together with the light-emitting element. Thus, there is a problem in that the time and energy that have been spent on forming the uneven structure and materials included in the uneven structure would be wasted in vain.

The present invention is made in view of the foregoing technical background. Thus, an object is to provide a light-emitting device having a structure in which a high refractive index component is provided between a solid light-emitting element and air, has an uneven structure on a surface in contact with air, and can be reused.

Another object is to provide a lighting device to which the light-emitting device is applied.

In order to achieve at least one of the above objects, the present invention focused on how to connect the solid light-emitting element to the uneven structure that is provided in contact with air and has high refractive index. Then, a method by which the uneven structure is connected to the light-emitting element via a high refractive index liquid was arrived at. With the use of the high refractive index liquid, the light-emitting element and the uneven structure can be optically connected to each other and can be physically separated from each other.

That is, one embodiment of the present invention is a light-emitting device including a substrate having a refractive index of 1.6 or higher and a light-transmitting property to visible light (hereinafter simply referred to as a light-transmitting property), a solid light-emitting element including a light-emitting region having a refractive index of 1.6 or higher on one surface of the substrate, and a component having a refractive index of 1.6 or higher and a light-transmitting property on the other surface of the substrate, wherein the component includes an uneven structure on a surface in contact with air and is connected to the substrate via a liquid having a refractive index of 1.6 or higher and a light-transmitting property.

Another embodiment of the present invention is a light-emitting device including a substrate having a refractive index of 1.6 or higher and a light-transmitting property, a solid light-emitting element including a light-emitting region having a refractive index of 1.6 or higher on one surface of the substrate, and a hemispherical component having a refractive index of 1.6 or higher and a light-transmitting property on the other surface of the substrate, wherein the component is connected to the substrate via a liquid having a refractive index of 1.6 or higher and a light-transmitting property.

According to one embodiment of the present invention described above, with the use of a high refractive index liquid, the high refractive index component can be optically connected to the high refractive index substrate without generating a layer with a low refractive index therebetween (e.g., air); thus, high light extraction efficiency can be realized. In addition, with the use of a liquid having fluidity, the component can be detached from the substrate and the component can be reused.

Another embodiment of the present invention is the above-described light-emitting device wherein the solid light-emitting element includes the light-emitting region interposed between a first electrode that is formed over the substrate and has a refractive index of 1.6 or higher and a light-transmitting property and a second electrode overlapping with the first electrode, and wherein the light-emitting region includes a light-emitting layer containing a light-emitting organic compound.

According to one embodiment of the present invention described above, light emission can be extracted with high efficiency from a light-emitting region which is spread out in a plane, through a first electrode having a light-transmitting property. In addition, with the use of a liquid having fluidity, the component can be detached from the substrate and the component can be reused.

Another embodiment of the present invention is a lighting device including the light-emitting device in a light-emitting portion.

According to one embodiment of the present invention, it is possible to provide a light-emitting device having a structure in which a high refractive index component is provided between a solid light-emitting element and air, has an uneven structure on a surface in contact with air, and can be reused.

DETAILED DESCRIPTION OF THE INVENTION

Figure 1A:
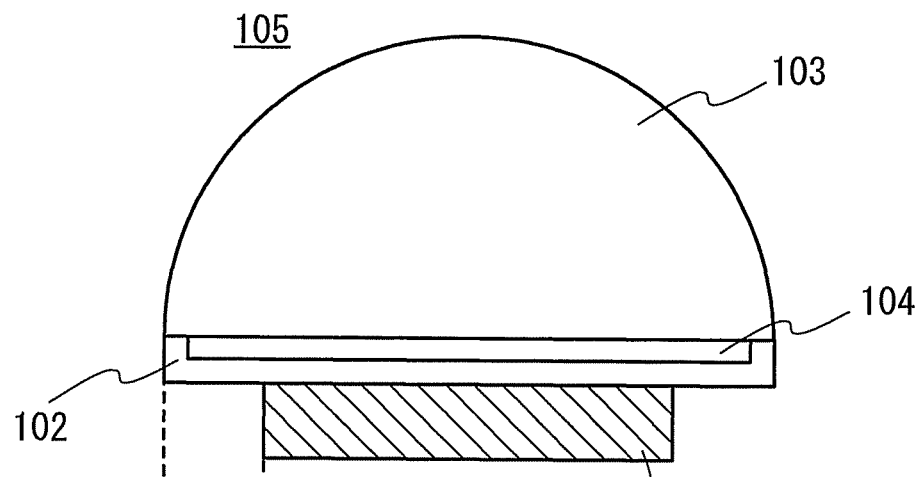
FIGS. 1A and 1B illustrate a light-emitting device which is one embodiment of the present invention.

Embodiments will be described in detail with reference to the accompanying drawings. Note that the invention is not limited to the following description, and it will be easily understood by those skilled in the art that various changes and modifications can be made without departing from the spirit and scope of the invention. Therefore, the invention should not be construed as being limited to the description in the following embodiments. Note that in the structures of the invention described below, the same portions or portions having similar functions are denoted by the same reference numerals in different drawings, and description of such portions is not repeated.

Embodiment 1

In this embodiment, a light-emitting device which is one embodiment of the present invention is described with reference to FIGS. 1A and 1B, FIGS. 2A and 2B, FIG. 3, FIG. 5, and FIGS. 6A and 6B.

<Basic Structure of Light-Emitting Device>

Figure 1B:
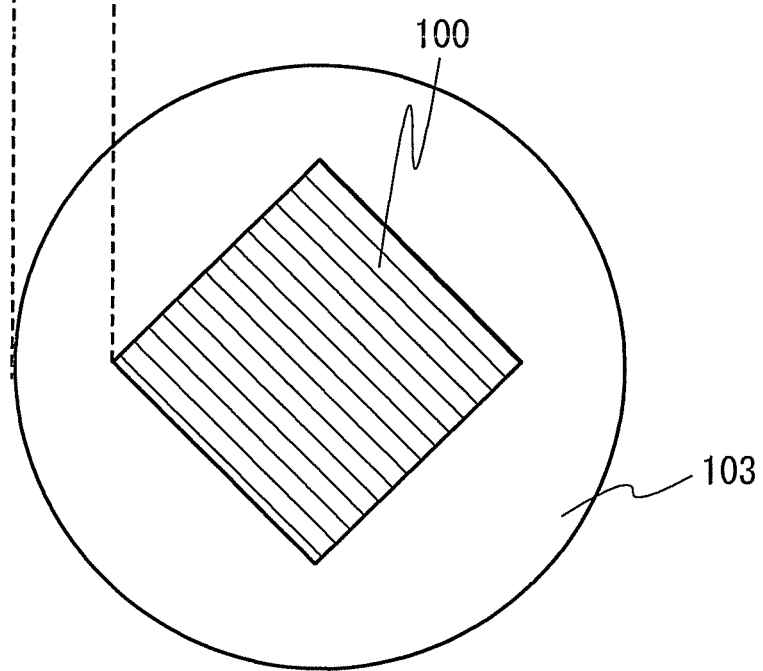

FIG. 1A is an example of a cross-sectional view of a light-emitting device, and FIG. 1B is an example of a plan view of the light-emitting device.

The light-emitting device of this embodiment includes a solid light-emitting element 100, a high refractive index substrate 102, a high refractive index liquid layer 104, and a high refractive index component 103. Light emitted from the solid light-emitting element 100 is extracted through the high refractive index component 103 to an outside 105 (e.g., into air).

Since the light-emitting device of this embodiment includes the high refractive index liquid layer 104, the high refractive index component 103 can be optically connected to the high refractive index substrate 102 without generating a layer with a low refractive index therebetween (e.g., air); thus, high light extraction efficiency can be realized. In addition, with the use of a liquid having fluidity, the component can be detached from the substrate and the component can be reused.

The high refractive index component 103 is fixed to the high refractive index substrate 102 so as to be detachable.

Extraction through the high refractive index component 103 can prevent the phenomenon that incident light from a high refractive index medium to a low refractive index medium with an angle larger than the critical angle is fully reflected and the light extraction efficiency is decreased, which improves the light extraction efficiency.

As the solid light-emitting element 100, a material with a refractive index of 1.6 or higher, such as a LED (light-emitting diode), an organic EL (electroluminescence) element, or an inorganic EL element, can be used. Examples in each of which an organic EL is used for the solid light-emitting element 100 are described in detail in Embodiment 2. There is no limitation on a planar shape of the solid light-emitting element; the planar shape may be a polygonal shape such as a square illustrated in FIG. 1B or a circular shape illustrated in FIG. 2B.

The high refractive index substrate 102 can be formed using a material that has a light-transmitting property to visible light (hereinafter simply referred to as a light-transmitting property) and a refractive index of 1.6 or higher, preferably higher than or equal to 1.7 and lower than or equal to 2.1. It is possible to use a high refractive index glass substrate (e.g., a glass substrate containing lanthanum or the like) whose refractive index is controlled by an impurity component in the glass.

The high refractive index liquid layer 104 can be formed using a liquid that has a light-transmitting property and a refractive index of 1.6 or higher, preferably higher than or equal to 1.7 and lower than or equal to 2.1. Examples of the liquid having a refractive index of 1.6 or higher include a catalytic liquid (a refractive index liquid) that contains sulfur and methylene iodide and has a refractive index of 1.75 to 1.78, a catalytic liquid (a refractive index liquid) that contains 1-bromonaphthalene and methylene iodide and has a refractive index of 1.70, and the like. Note that a liquid used for the high refractive index liquid layer 104 may be a material that exhibits fluidity at temperatures of higher than or equal to −20° C. and lower than or equal to 200° C. For example, it is possible to use a material that does not exhibit fluidity at room temperature but exhibits fluidity by being heated to be detachable.

Figure 2A:
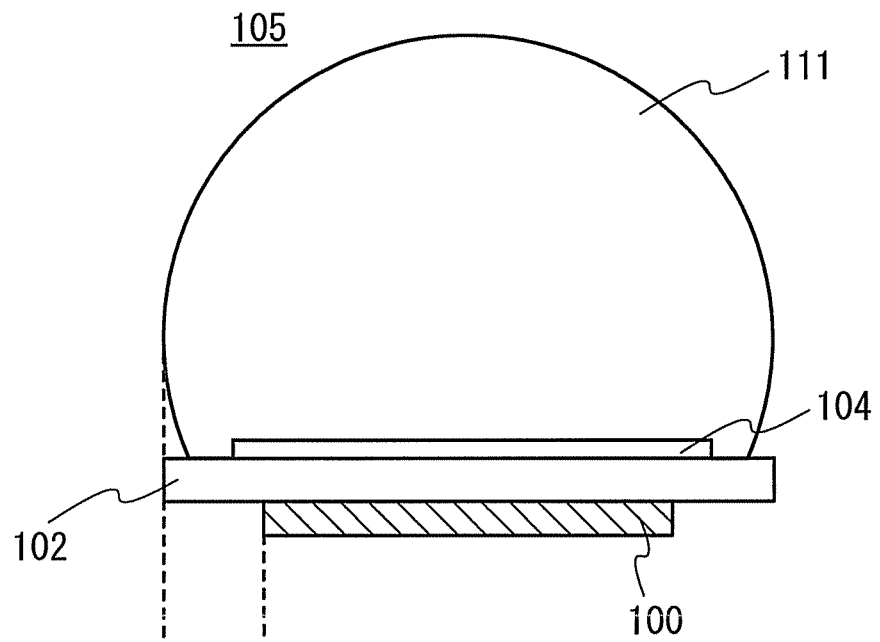
FIGS. 2A and 2B illustrate a light-emitting device which is one embodiment of the present invention.
Figure 2B:
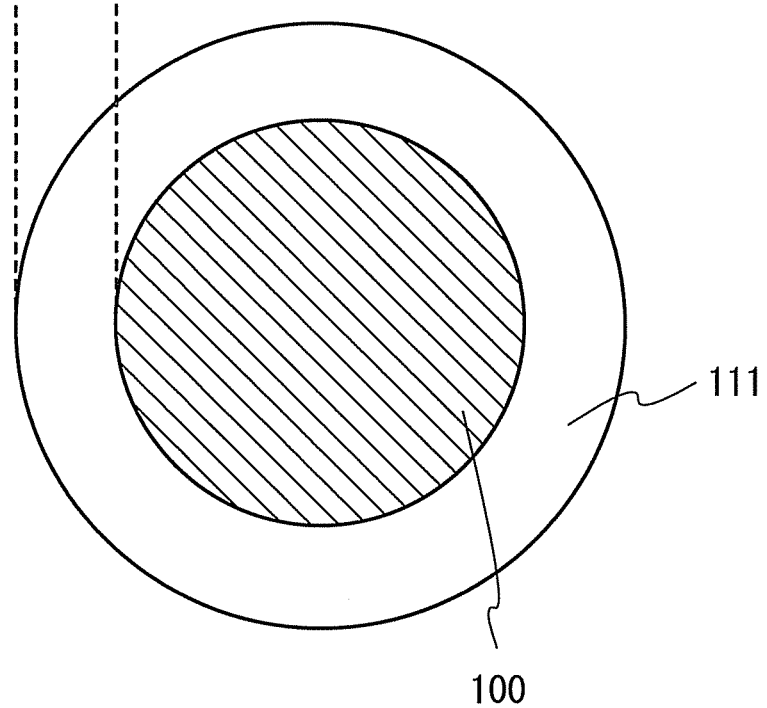
Figure 3:
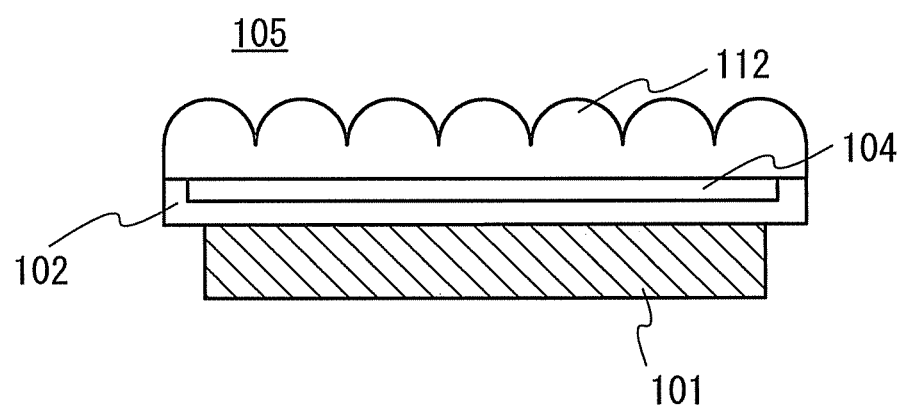
FIG. 3 illustrates a light-emitting device which is one embodiment of the present invention.

The high refractive index component 103 can be formed using a material that has a light-transmitting property and a refractive index of 1.6 or higher, preferably higher than or equal to 1.7 and lower than or equal to 2.1. The light-emitting device illustrated in FIG. 1A includes the hemispherical high refractive index component 103; however, there is no limitation on the shape, and a spherical component 111 having a spherical surface wider than a hemispherical surface may also be used (FIG. 2A). With a spherical surface wider than a hemispherical surface, an area of a portion where light is extracted is increased, so that the light extraction efficiency can be improved. Alternatively, a component 112 having a plurality of uneven structures may be formed with the use of a microlens array or the like (FIG. 3).

Examples of the material that can be used for the high refractive index components 103, 111, and 112 include glass, resin, and the like. Examples of the high refractive index resin include resin containing bromine, resin containing sulfur, and the like. For example, sulfur-containing polyimide resin, episulfide resin, thiourethane resin, brominated aromatic resin, or the like can be used.

Such a material can be formed into a hemispherical shape or the like by using etching, an electron beam, a laser beam, a mold, or the like.

The high refractive index substrate and the high refractive index component preferably have a shape such that they can be fixed to each other (e.g., the high refractive index component can be inserted in or cover the high refractive index substrate) because in that case, the high refractive index component and the high refractive index substrate can be fixed to each other without an adhesive or the like and be easily detached. By fixing the high refractive index component and the high refractive index substrate to each other, leakage or evaporation of the high refractive index liquid layer can be prevented. The high refractive index substrate and the high refractive index component may be fixed to each other with the use of a known sealant, adhesive, or the like as long as they are detachable from each other.

<Method for Fabricating Light-Emitting Device>

Figure 5:
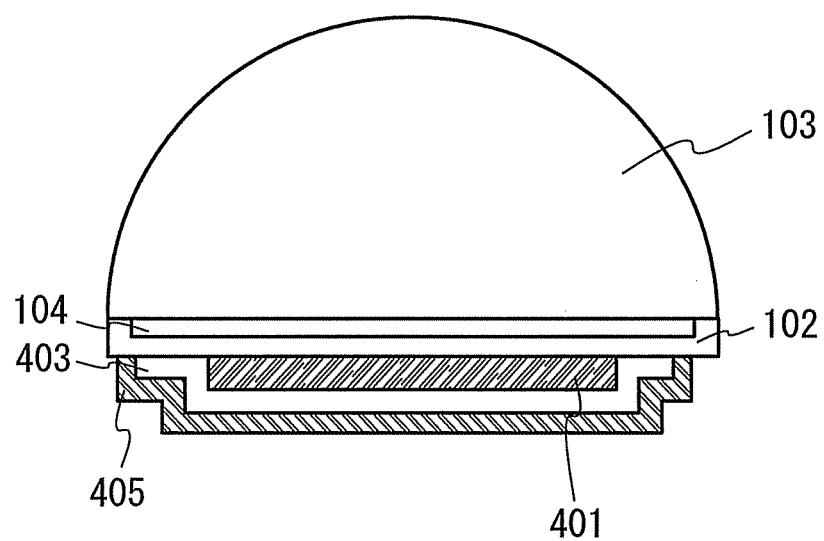
FIG. 5 illustrates a light-emitting device which is one embodiment of the present invention.

FIG. 5 is an example of a cross-sectional view of the light-emitting device which is one embodiment of the present invention. In FIG. 5, a structure in which an organic EL element is used as a solid light-emitting element is described as an example.

First, the organic EL element is fabricated over the high refractive index substrate 102. The organic EL element includes a first electrode 401, an EL layer 403, and a second electrode 405. A detailed method for fabricating the organic EL element is described in Embodiment 2.

Next, over a surface of the high refractive index substrate 102, which is opposite to the surface over which the organic EL element is formed, the high refractive index liquid layer 104 is formed, and sealing is performed with the high refractive index component 103 which is molded to be hemispherical.

In this embodiment, a depression portion is provided for the high refractive index substrate 102, and a high refractive index liquid is poured into the depression portion. After that, the high refractive index component 103 is adhered and fixed to the high refractive index substrate 102 with an adhesive. Note that the depression portion may be provided for the high refractive index component 103 instead of providing the depression portion for the high refractive index substrate 102, and a high refractive index liquid may be poured into the depression portion to form the high refractive index liquid layer 104.

In the above manner, the light-emitting device of this embodiment can be fabricated.

Note that in this embodiment, the solid light-emitting element (here, an organic light-emitting element) is fabricated over the high refractive index substrate 102 first; however, the solid light-emitting element may be fabricated after the high refractive index liquid layer 104 and the high refractive index component 103 are fixed to the high refractive index substrate 102. In this case, a step in which a material used for the high refractive index component 103 is formed to have an uneven structure such as a hemispherical shape may be performed either before or after the fabrication of the solid light-emitting element.

<Other Structures of Light-Emitting Device>

Other structures of the light-emitting device which is one embodiment of the present invention are described with reference to FIGS. 6A and 6B.

Figure 6A:
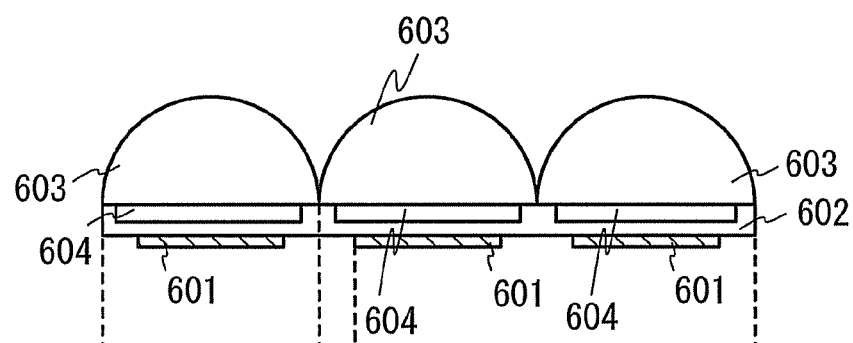
FIGS. 6A and 6B illustrate a light-emitting device which is one embodiment of the present invention.
Figure 6B:
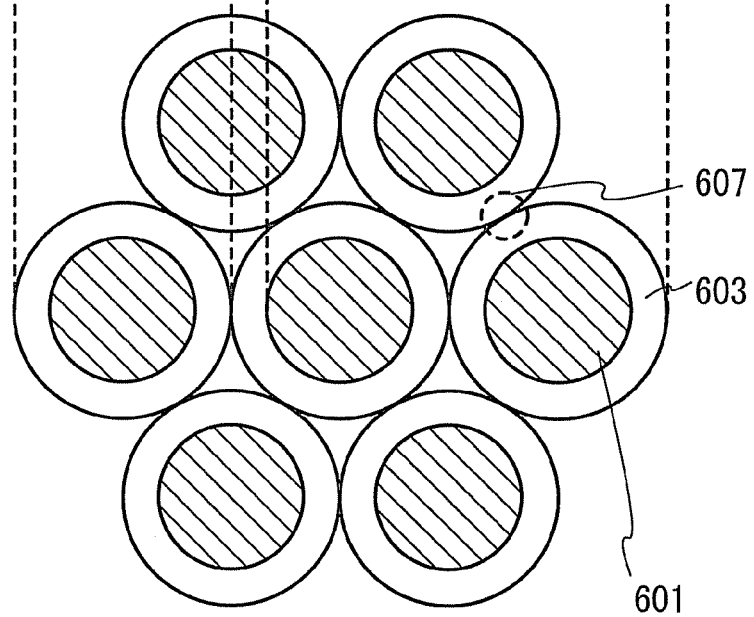

FIG. 6A is an example of a cross-sectional view of the light-emitting device, and FIG. 6B is an example of a plan view of the light-emitting device.

The light-emitting device in FIGS. 6A and 6B include a plurality of solid light-emitting elements 601, a high refractive index substrate 602 having a plurality of depression portions each of which overlaps with each of the solid light-emitting elements 601, a high refractive index liquid layer 604 in the depression portion, and a plurality of high refractive index components 603 each of which overlaps with each of the solid light-emitting elements 601. That is, the light-emitting device illustrated in FIGS. 6A and 6B includes a plurality of elements each having a pair of the solid light-emitting element 601 and the hemispherical high refractive index component 603.

As illustrated in FIG. 6B, the plurality of elements are arranged with a closest packed structure. Seven elements are illustrated in FIG. 6B, but the number of the elements is not limited thereto; the light-emitting device may include a plurality of elements. The high refractive index component 603 may also have a structure in which a plurality of hemispherical components are integrated to form one component (also referred to as an integrated component). An integrated component includes a plurality of hemispherical portions.

Here, the closest packed structure means a structure in which in a portion 607 where the plurality of hemispherical components are adjacent to each other, a space is not formed as much as possible but also includes a structure in which some spaces are formed owing to an error in design.

Note that this embodiment can be combined with any of the other embodiments in this specification as appropriate.

Embodiment 2

In this embodiment, a solid light-emitting element included in a light-emitting element which is one embodiment of the present invention is described with reference to FIGS. 4A to 4C.

In this embodiment, an example of an organic EL element is described.

Figure 4A:
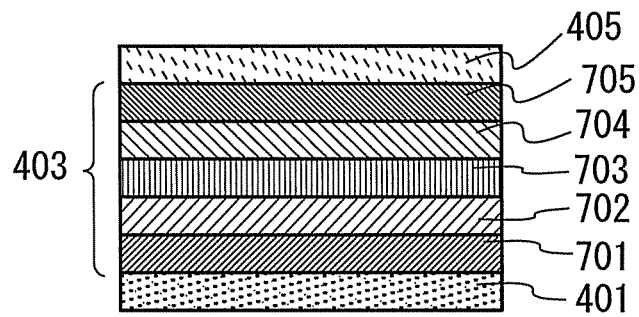
FIGS. 4A to 4C illustrate solid light-emitting elements each of which is one embodiment of the present invention.

A light-emitting element illustrated in FIG. 4A includes the first electrode 401, the EL layer 403 over the first electrode 401, and the second electrode 405 over the EL layer 403.

The EL layer 403 includes at least a light-emitting layer containing a light-emitting organic compound. In addition, the EL layer 403 can have a stacked-layer structure where a layer that contains a substance having a high electron-transport property, a layer that contains a substance having a high hole-transport property, a layer that contains a substance having a high electron-injection property, a layer that contains a substance having a high hole-injection property, a layer that contains a bipolar substance (a substance having a high electron-transport property and a high hole-transport property), and the like are combined as appropriate. For example, in the EL layer 403 in FIG. 4A, a hole-injection layer 701, a hole-transport layer 702, a light-emitting layer 703, an electron-transport layer 704, and an electron-injection layer 705 are stacked in this order over the first electrode 401. In addition, in this embodiment, the refractive index of the EL layer 403 is 1.7 or higher.

Next, a method for fabricating the light-emitting element illustrated in FIG. 4A is described.

First, the first electrode 401 is formed. Since light from the EL layer 403 is extracted through the first electrode 401, the first electrode 401 is formed using a light-transmitting material.

As the light-transmitting material, indium oxide, an alloy of indium oxide and tin oxide (also referred to as ITO), an alloy of indium oxide and zinc oxide (also referred to as IZO), zinc oxide, zinc oxide to which gallium is added, or the like can be used.

In addition, for the first electrode 401, a metal material such as gold, platinum, nickel, tungsten, chromium, molybdenum, iron, cobalt, copper, palladium, or titanium can be used. Further, a nitride of the metal material (such as titanium nitride)

or the like may be used. In the case of using the metal material (or the nitride thereof), the first electrode 401 may be thinned so as to be able to transmit light.

Next, the EL layer 403 is formed over the first electrode 401. In FIG. 4A, the EL layer 403 includes the hole-injection layer 701, the hole-transport layer 702, the light-emitting layer 703, the electron-transport layer 704, and the electron-injection layer 705.

The hole-injection layer 701 is a layer that contains a substance having a high hole-injection property. As the substance having a high hole-injection property, for example, a metal oxide such as molybdenum oxide, titanium oxide, vanadium oxide, rhenium oxide, ruthenium oxide, chromium oxide, zirconium oxide, hafnium oxide, tantalum oxide, silver oxide, tungsten oxide, or manganese oxide can be used. A phthalocyanine-based compound such as phthalocyanine (abbreviation: $H_2Pc$), or copper(II) phthalocyanine (abbreviation: CuPc) can also be used.

Alternatively, any of the following aromatic amine compounds which are low molecular organic compounds can be used: 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), 4,4'-bis(N-{4-[N'-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), or the like.

Further alternatively, any of high molecular compounds (e.g., oligomers, dendrimers, or polymers) can be used. Examples of high molecular compounds include poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide](abbreviation: PTPDMA), and poly[N,N'-bis(4-butylphenyl)-N,N'-bis(phenyl)benzidine (abbreviation: Poly-TPD). Alternatively, a high molecular compound to which acid is added, such as poly(3,4-ethylenedioxythiophene)/poly(styrenesulfonic acid) (PEDOT/PSS) or polyaniline/poly(styrenesulfonic acid) (PAni/PSS), can be used.

In particular, for the hole-injection layer 701, a composite material in which an acceptor substance is mixed with an organic compound having a high hole-transport property is preferably used. Note that by the use of the composite material in which an acceptor substance is added to a substance having a high hole-transport property, hole injection from the first electrode 401 is facilitated, which leads to a reduction in the driving voltage of the light-emitting element. Such a composite material can be formed by co-evaporating a substance having a high hole-transport property and an acceptor substance. The hole-injection layer 701 is formed using the composite material, whereby hole injection from the first electrode 401 to the EL layer 403 is facilitated.

As the organic compound for the composite material, any of various compounds such as aromatic amine compounds, carbazole derivatives, aromatic hydrocarbon, and high molecular compounds (e.g., oligomer, dendrimer, or polymer) can be used. The organic compound used for the composite material is preferably an organic compound having a high hole-transport property. Specifically, a substance having a hole mobility of $10^{-6}$ cm$^2$/Vs or higher is preferably used. However, a substance other than these substances may also be used as long as a hole-transport property thereof is higher than an electron-transport property thereof. The organic compounds which can be used for the composite material are specifically shown below.

Examples of the organic compounds that can be used for the composite material include: aromatic amine compounds such as TDATA, MTDATA, DPAB, DNTPD, DPA3B, PCzPCA1, PCzPCA2, PCzPCN1, 4,4'-bis[N-(1-naphthyl)-N-phenylamino]biphenyl (abbreviation: NPB or α-NPD), and N,N'-bis(3-methylphenyl)-N,N'-diphenyl-[1,1'-biphenyl]-4,4'-diamine (abbreviation: TPD), and 4-phenyl-4'-(9-phenylfluoren-9-yl)triphenylamine (abbreviation: BPAFLP); and carbazole derivatives such as 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 9-phenyl-3-[4-(10-phenyl-9-anthryl)phenyl]-9H-carbazole (abbreviation: PCzPA), and 1,4-bis[4-(N-carbazolyl)phenyl-2,3,5,6-tetraphenylbenzene.

In addition, it is possible to use any of the following aromatic hydrocarbon compounds: 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 9,10-bis[2-(1-naphthyl)phenyl]-2-tert-butylanthracene, 9,10-bis[2-(1-naphthyl)phenyl]anthracene, 2,3,6,7-tetramethyl-9,10-di(1-naphthyl)anthracene, or the like.

Further alternatively, an aromatic hydrocarbon compound such as 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, pentacene, coronene, 4,4'-bis(2,2-diphenylvinyl)biphenyl (abbreviation: DPVBi), or 9,10-bis[4-(2,2-diphenylvinyl)phenyl]anthracene (abbreviation: DPVPA) can be used.

Further, as the electron acceptor, organic compounds such as 7,7,8,8-tetracyano-2,3,5,6-tetrafluoroquinodimethane (abbreviation: $F_4$-TCNQ) and chloranil; and transition metal oxides can be given. In addition, oxides of metals belonging to Groups 4 to 8 in the periodic table can also be given. Specifically, vanadium oxide, niobium oxide, tantalum oxide, chromium oxide, molybdenum oxide, tungsten oxide, manganese oxide, and rhenium oxide are preferable since their electron-accepting property is high. Among these, molybdenum oxide is especially preferable since it is stable in air and its hygroscopic property is low and is easily treated.

The composite material may be formed using the above-described electron acceptor and the above-described high molecular compound such as PVK, PVTPA, PTPDMA, or Poly-TPD and used for the hole-injection layer 701.

The hole-transport layer 702 is a layer that contains a substance having a high hole-transport property. As the substance having a high hole-transport property, any of the following aromatic amine compounds can be used, for example: NPB; TPD; BPAFLP; 4,4'-bis[N-(9,9-dimethylfluoren-2-yl)-N-phenylamino]biphenyl (abbreviation: DFLDPBi); and 4,4'-bis[N-(spiro-9,9'-bifluoren-2-yl)-N-phenylamino]biphenyl (abbreviation: BSPB). The substances mentioned here mainly have a hole mobility of $10^{-6}$ cm$^2$/Vs or higher. However, a substance other than these substances may also be used as long as a hole-transport property thereof is higher than an electron-transport property thereof. The layer that contains a substance having a high hole-transport property is not limited to a single layer, and two or more layers that contain the above-described substances may be stacked.

For the hole-transport layer 702, a carbazole derivative such as CBP, CzPA, or PCzPA or an anthracene derivative such as t-BuDNA, DNA, or DPAnth may be used.

For the hole-transport layer 702, a high molecular compound such as PVK, PVTPA, PTPDMA, or Poly-TPD can be used.

The light-emitting layer 703 is a layer that contains an organic compound having a light-emitting property. As the organic compound having a light-emitting property, for example, a fluorescent compound which exhibits fluorescence or a phosphorescent compound which exhibits phosphorescence can be used.

The fluorescent compounds that can be used for the light-emitting layer 703 are given below. Examples of the materials that emit blue light include N,N'-bis[4-(9H-carbazol-9-yl) phenyl]-N,N'-diphenylstilbene-4,4'-diamine (abbreviation: YGA2S), 4-(9H-carbazol-9-yl)-4'-(10-phenyl-9-anthryl) triphenylamine (abbreviation: YGAPA), 4-(10-phenyl-9-anthryl)-4'-(9-phenyl-9H-carbazol-3-yl)triphenylamine (abbreviation: PCBAPA), and the like. In addition, examples of the materials that emit green light include N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N',N'-triphenyl-1,4-phenylenediamine (abbreviation: 2DPAPA), N-[9,10-bis (1,1'-biphenyl-2-yl)-2-anthryl]-N,N',N'-triphenyl-1,4-phenylenediamine (abbreviation: 2DPABPhA), N-[9,10-bis(1, 1'-biphenyl-2-yl)]-N-[4-(9H-carbazol-9-yl)phenyl]-N-phenylanthracen-2-amine (abbreviation: 2YGABPhA), N,N, 9-triphenylanthracen-9-amine (abbreviation: DPhAPhA), and the like. Further, examples of the materials that emit yellow light include rubrene, 5,12-bis(1,1'-biphenyl-4-yl)-6, 11-diphenyltetracene (abbreviation: BPT), and the like. Furthermore, examples of the materials that emit red light include N,N,N',N'-tetrakis(4-methylphenyl)tetracene-5,11-diamine (abbreviation: p-mPhTD), 7,14-diphenyl-N,N,',N'-tetrakis(4-methylphenyl)acenaphtho[1,2-a]fluoranthene-3, 10-diamine (abbreviation: p-mPhAFD), and the like.

The phosphorescent compounds that can be used for the light-emitting layer 703 are given below. Examples of the materials that emit blue light include bis[2-(4',6'-difluorophenyl)pyridinato-N,$C^{2'}$]iridium(III)tetrakis(1-pyrazolyl)borate (abbreviation: FIr6), bis[2-(4',6'-difluorophenyl)pyridinato-N,$C^{2'}$]iridium(III)picolinate (abbreviation: FIrpic), bis{2-[3', 5'-bis(trifluoromethyl)phenyl]pyridinato-N,$C^{2'}$}-iridium(III) picolinate (abbreviation: Ir(CF$_3$ppy)$_2$(pic)), bis[2-(4',6'-difluorophenyl)pyridinato-N,$C^{2'}$]iridium(III)acetylacetonate (abbreviation: FIr(acac)), and the like. Examples of the materials that emit green light include tris(2-phenylpyridinato-N, $C^{2'}$)iridium(III) (abbreviation: Ir(ppy)$_3$), bis(2-phenylpyridinato-N,$C^{2'}$)iridium(III)acetylacetonate (abbreviation: Ir(ppy)$_2$(acac)), bis(1,2-diphenyl-1H-benzimidazolato)iridium(III)acetylacetonate (abbreviation: Ir(pbi)$_2$(acac)), bis (benzo[h]quinolinato)iridium(III)acetylacetonate (abbreviation: Ir(bzq)$_2$(acac)), tris(benzo[h]quinolinato)iridium(III) (abbreviation: Ir(bzq)$_3$), and the like. Examples of the materials that emit yellow light include bis(2,4-diphenyl-1,3-oxazolato-N,$C^{2'}$)iridium(III)acetylacetonate (abbreviation: Ir(dpo)$_2$(acac)), bis[2-(4'-(perfluorophenylphenyl)pyridinato]iridium(III)acetylacetonate (abbreviation: Ir(p-PF-ph)$_2$ (acac)), bis(2-phenylbenzothiazolato-N,$C^{2'}$)iridium(III) acetylacetonate (abbreviation: Ir(bt)$_2$(acac)), (acetylacetonato)bis[2,3-bis(4-fluorophenyl)-5-methylpyrazinato]iridium(III) (abbreviation: Ir(Fdppr-Me)$_2$ (acac)), (acetylacetonato)bis{2-(4-methoxyphenyl)-3,5-dimethylpyrazinato}iridium(III) (abbreviation: Ir(dmmoppr)$_2$(acac)), and the like. Examples of the materials that emit orange light include tris(2-phenylquinolinato-N, $C^{2'}$)iridium(III) (abbreviation: Ir(pq)$_3$), bis(2-phenylquinolinato-N,$C^{2'}$)iridium(III)acetylacetonate (abbreviation: Ir(pq)$_2$ (acac)), (acetylacetonato)bis(3,5-dimethyl-2-phenylpyrazinato)iridium(III) (abbreviation: Ir(mppr-Me)$_2$ (acac)), (acetylacetonato)bis(5-isopropyl-3-methyl-2-phenylpyrazinato)iridium(III) (abbreviation: Ir(mppr-iPr)$_2$ (acac)), and the like. Examples of the materials that emit red light include organometallic complexes such as bis[2-(2'-benzo[4,5-α]thienyl)pyridinato-N,$C^{3'}$)iridium(III)acetylacetonate (abbreviation: Ir(btp)$_2$(acac)), bis(1-phenylisoquinolinato-N,$C^{2'}$)iridium(III)acetylacetonate (abbreviation: Ir(piq)$_2$(acac), (acetylacetonato)bis[2,3-bis(4-fluorophenyequinoxalinato]iridium(III) (abbreviation: Ir(Fdpq)$_2$(acac)), (acetylacetonato)bis(2,3,5-triphenylpyrazinato)iridium(III) (abbreviation: Ir(tppr)$_2$(acac)), (dipivaloylmethanato)bis(2, 3,5-triphenylpyrazinato)iridium(III) (abbreviation: Ir(tppr)$_2$ (dpm)), and (2,3,7,8,12,13,17,18-octaethyl-21H,23H-porphine)platinum(II) (abbreviation: PtOEP). Any of the following rare earth metal complexes can be used as a phosphorescent compound: tris(acetylacetonato)(monophenanthroline)terbium(III) (abbreviation: Tb(acac)$_3$(Phen)); tris(1, 3-diphenyl-1,3-propanedionato)(monophenanthroline) europium(III) (abbreviation: Eu(DBM)$_3$(Phen)); and tris[1-(2-thenoyl)-3,3,3-trifluoroacetonato](monophenanthroline) europium(III) (abbreviation: Eu(TTA)$_3$(Phen)), because their light emission (generated by electronic transition between different multiplicities) is from a rare earth metal ion.

Note that the light-emitting layer 703 may have a structure in which the above-described light-emitting organic compound (a guest material) is dispersed in another substance (a host material). As a host material, various kinds of materials can be used, and it is preferable to use a substance which has a lowest unoccupied molecular orbital level (LUMO level) higher than the light-emitting substance and has a highest occupied molecular orbital level (HOMO level) lower than that of the light-emitting substance.

Specific examples of the host material are as follows: a metal complex such as tris(8-quinolinolato)aluminum(III) (abbreviation: Alq), tris(4-methyl-8-quinolinolato)aluminum(III) (abbreviation: Almq$_3$), bis(10-hydroxybenzo[h] quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), or bis[2-(2-benzothiazolyl)phenolato]zinc (II) (abbreviation: ZnBTZ); a heterocyclic compound such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2''-(1,3,5-benzenetriyl)tris(1-phenyl-1H-benzimidazole) (abbreviation: TPBI), bathophenanthroline (abbreviation: BPhen), or bathocuproine (BCP); a condensed aromatic compound such as 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10- di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 3,3',3"-(benzene-1,3,5-triyl)tripyrene (abbreviation: TPB3), 9,10-diphenylanthracene (abbreviation: DPAnth), or 6,12-dimethoxy-5,11-diphenylchrysene; an aromatic amine compound such as N,N-dipheyl-9-[4-(10-phenyl-9-anthryl)phenyl]-9H-carbazol-3-amine (abbreviation: CzA1PA), 4-(10-phenyl-9-anthryryl)triphenylamine (abbreviation: DPhPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N-(9,10-diphenyl-2-anthryl)-N,9-diphenyl-9H-carbazol-3-amine (abbreviation: 2PCAPA), NPB (or α-NPD), TPD, DFLDPBi, or BSPB; and the like.

Alternatively, as the host material, plural kinds of materials can be used. For example, in order to suppress crystallization, a substance such as rubrene which suppresses crystallization, may be further added. In addition, NPB, Alq, or the like may be further added in order to efficiently transfer energy to the guest material.

When a structure in which a guest material is dispersed in a host material is employed, crystallization of the light-emitting layer 703 can be suppressed. Further, concentration quenching due to high concentration of the guest material can be suppressed.

For the light-emitting layer 703, a high molecular compound can be used. Specifically, examples of the materials that emit blue light include poly(9,9-dioctylfluorene-2,7-diyl) (abbreviation: PFO), poly[(9,9-dioctylfluorene-2,7-diyl)-co-(2,5-dimethoxybenzene-1,4-diyl)] (abbreviation: PF-DMOP), poly{(9,9-dioctylfluorene-2,7-diyl)-co-[N,N'-di-(p-butylphenyl)-1,4-diaminobenzene]} (abbreviation: TAB-PFH), and the like. Further, examples of the materials that emit green light include poly(p-phenylenevinylene) (abbreviation: PPV), poly[(9,9-dihexylfluorene-2,7-diyl)-alt-co-(benzo[2,1,3]thiadiazole-4,7-diyl)] (abbreviation: PFBT), poly[(9,9-dioctyl-2,7-divinylenefluorenylene)-alt-co-(2-methoxy-5-(2-ethylhexyloxy)-1,4-phenylene)], and the like. Furthermore, examples of the materials that emit orange to red light include poly[2-methoxy-5-(2'-ethylhexoxy)-1,4-phenylenevinylene] (abbreviation: MEH-PPV), poly(3-butylthiophene-2,5-diyl) (abbreviation: R4-PAT), poly{[9,9-dihexyl-2,7-bis(1-cyanovinylene)fluorenylene]-alt-co-[2,5-bis(N,N'-diphenylamino)-1,4-phenylene]}, poly{[2-methoxy-5-(2-ethylhexyloxy)-1,4-bis(1-cyanovinylenephenylene)]-alt-co-[2,5-bis(N,N'-diphenylamino)-1,4-phenylene]} (abbreviation: CN-PPV-DPD), and the like.

Further, by providing a plurality of light-emitting layers and making emission colors of the light-emitting layers different, light emission having a desired color can be obtained from the light-emitting element as a whole. For example, the emission colors of first and second light-emitting layers are complementary in a light-emitting element having the two light-emitting layers, whereby the light-emitting element can be made to emit white light as a whole. Note that the word "complementary" means color relationship in which an achromatic color is obtained when colors are mixed. That is, emission of white light can be obtained by mixture of light emitted from substances whose emission colors are complementary colors. This can be applied to a light-emitting element having three or more light-emitting layers.

The electron-transport layer 704 is a layer that contains a substance having a high electron-transport property. As the substance having a high electron-transport property, any of the following substances can be used, for example: a metal complex having a quinoline skeleton or a benzoquinoline skeleton such as tris(8-quinolinolato)aluminum (abbreviation: Alq), tris(4-methyl-8-quinolinolato)aluminum (abbreviation: Almq$_3$), bis(10-hydroxybenzo[h]quinolinato)beryllium (abbreviation: BeBq$_2$), or bis(2-methyl-8-quinolinolato)(4-phenylphenolato)aluminum (abbreviation: BAlq). Alternatively, a metal complex or the like including an oxazole-based or thiazole-based ligand, such as bis[2-(2-hydroxyphenyl)benzoxazolato]zinc (abbreviation: Zn(BOX)$_2$) or bis[2-(2-hydroxyphenyl)benzothiazolato]zinc (abbreviation: Zn(BTZ)$_2$) can be used. Besides the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can also be used. The substances mentioned here mainly have an electron mobility of $10^{-6}$ cm$^2$/Vs or higher. Furthermore, the electron-transport layer is not limited to a single layer, and two or more layers that contains the above-described substances may be stacked.

The electron-injection layer 705 is a layer that contains a substance having a high electron-injection property. For the electron-injection layer 705, an alkali metal, an alkaline-earth metal, or a compound thereof, such as lithium, cesium, calcium, lithium fluoride, cesium fluoride, calcium fluoride, or lithium oxide, can be used. In addition, a rare earth metal compound such as erbium fluoride can also be used. Any of the substances contained in the electron-transport layer 704 which are given above can also be used.

Note that the hole-injection layer 701, the hole-transport layer 702, the light-emitting layer 703, the electron-transport layer 704, and the electron-injection layer 705 which are described above can each be formed by a method such as an evaporation method (e.g., a vacuum evaporation method), an ink-jet method, or a coating method.

Figure 4B:
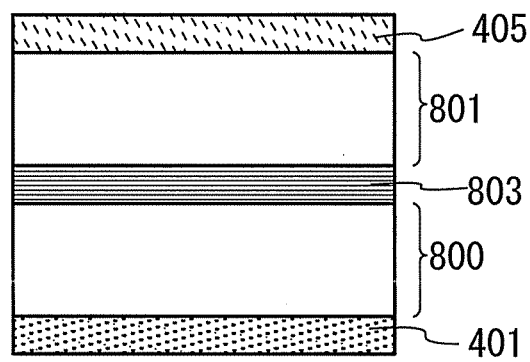

Note that a plurality of EL layers may be stacked between the first electrode 401 and the second electrode 405 as illustrated in FIG. 4B. In that case, a charge generation layer 803 is preferably provided between a first EL layer 800 and a second EL layer 801 which are stacked. The charge generation layer 803 can be formed using the above-mentioned composite material. Further, the charge generation layer 803 may have a stacked structure including a layer that contains the composite material and a layer that contains another material. In that case, as the layer that contains another material, a layer that contains an electron-donating substance and a substance having a high electron-transport property, a layer formed of a transparent conductive film, or the like can be used. As for a light-emitting element having such a structure, problems such as energy transfer and quenching hardly occur, and a light-emitting element which has both high emission efficiency and a long lifetime can be easily obtained due to expansion in the choice of materials. Moreover, a light-emitting element which provides phosphorescence from one of the EL layers and fluorescence from the other of the EL layers can be readily obtained. Note that this structure can be combined with the above-described structures of the EL layer.

Further, by forming EL layers to emit light of different colors from each other, a light-emitting element as a whole can provide light emission of a desired color. For example, by forming a light-emitting element having two EL layers such that the emission color of the first EL layer and the emission color of the second EL layer are complementary colors, the light-emitting element can emit white light as a whole. This can be applied to a light-emitting element having three or more EL layers.

Figure 4C:
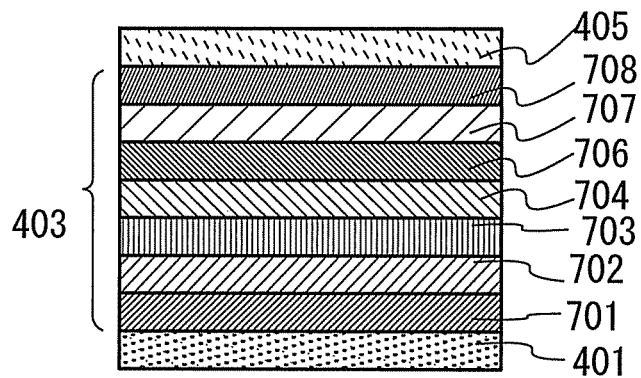

As illustrated in FIG. 4C, the EL layer 403 may include the hole-injection layer 701, the hole-transport layer 702, the light-emitting layer 703, the electron-transport layer 704, an electron-injection buffer layer 706, an electron-relay layer 707, and a composite material layer 708 which is in contact with the second electrode 405, between the first electrode 401 and the second electrode 405.

It is preferable to provide the composite material layer 708 which is in contact with the second electrode 405, in which case damage caused to the EL layer 403 particularly when the second electrode 405 is formed by a sputtering method can be reduced. The composite material layer 708 can be formed using the above-described composite material in which an acceptor substance is mixed with an organic compound having a high hole-transport property.

Further, by providing the electron-injection buffer layer 706, an injection barrier between the composite material layer 708 and the electron-transport layer 704 can be reduced; thus, electrons generated in the composite material layer 708 can be easily injected to the electron-transport layer 704.

A substance having a high electron-injection property can be used for the electron-injection buffer layer 706: for example, an alkali metal, an alkaline earth metal, a rare earth metal, a compound of the above metal (e.g., an alkali metal compound (including an oxide such as lithium oxide, a halide, or carbonate such as lithium carbonate or cesium carbonate), an alkaline earth metal compound (e.g., an oxide, a halide, or carbonate), or a rare earth metal compound (e.g., an oxide, a halide, or carbonate).

Further, in the case where the electron-injection buffer layer 706 contains a substance having a high electron-transport property and a donor substance, the donor substance is preferably added so that the mass ratio of the donor substance to the substance having a high electron-transport property is from 0.001:1 to 0.1:1. Note that as the donor substance, an organic compound such as tetrathianaphthacene (abbreviation: TTN), nickelocene, or decamethylnickelocene can be used as well as an alkali metal, an alkaline earth metal, a rare earth metal, a compound of the above metal (e.g., an alkali metal compound (including an oxide of lithium oxide or the like, a halide, and carbonate such as lithium carbonate or cesium carbonate), an alkaline earth metal compound (including an oxide, a halide, and carbonate), and a rare earth metal compound (including an oxide, a halide, and carbonate). Note that as the substance having a high electron-injection property, a material similar to the material for the electron-transport layer 704 described above can be used.

Furthermore, the electron-relay layer 707 is preferably formed between the electron-injection buffer layer 706 and the composite material layer 708. The electron-relay layer 707 is not necessarily provided; however, by providing the electron-relay layer 707 having a high electron-transport property, electrons can be rapidly transported to the electron-injection buffer layer 706.

The structure in which the electron-relay layer 707 is sandwiched between the composite material layer 708 and the electron-injection buffer layer 706 is a structure in which the acceptor substance contained in the composite material layer 708 and the donor substance contained in the electron-injection buffer layer 706 are less likely to interact with each other, and thus their functions hardly interfere with each other. Therefore, an increase in the driving voltage can be suppressed.

The electron-relay layer 707 contains a substance having a high electron-transport property and is formed so that the LUMO level of the substance having a high electron-transport property is located between the LUMO level of the acceptor substance contained in the composite material layer 708 and the LUMO level of the substance having a high electron-transport property contained in the electron-transport layer 704. In the case where the electron-relay layer 707 contains a donor substance, the donor level of the donor substance is controlled so as to be located between the LUMO level of the acceptor substance contained in the composite material layer 708 and the LUMO level of the substance having a high electron-transport property contained in the electron-transport layer 704. As a specific value of the energy level, the LUMO level of the substance having a high electron-transport property contained in the electron-relay layer 707 is preferably greater than or equal to −5.0 eV, more preferably greater than or equal to −5.0 eV and less than or equal to −3.0 eV.

As the substance having a high electron-transport property contained in the electron-relay layer 707, a phthalocyanine-based material or a metal complex having a metal-oxygen bond and an aromatic ligand is preferably used.

As the phthalocyanine-based material contained in the electron-relay layer 707, for example, any of CuPc, phthalocyanine tin(II) complex (SnPc), phthalocyanine zinc complex (ZnPc), cobalt(II) phthalocyanine, β-form (CoPc), phthalocyanine iron (FePc), and vanadyl 2,9,16,23-tetraphenoxy-29H,31H-phthalocyanine (PhO-VOPc), is preferably used.

As the metal complex having a metal-oxygen bond and an aromatic ligand, which is contained in the electron-relay layer 707, a metal complex having a metal-oxygen double bond is preferably used. The metal-oxygen double bond has acceptor properties (properties of easily accepting electrons); thus, electrons can be transferred (donated and accepted) more easily. Further, the metal complex which has a metal-oxygen double bond is considered stable. Thus, the use of the metal complex having the metal-oxygen double bond enables the light-emitting element to drive at low voltage more stably.

As a metal complex having a metal-oxygen bond and an aromatic ligand, a phthalocyanine-based material is preferable. Specifically, any of vanadyl phthalocyanine (VOPc), a phthalocyanine tin(IV) oxide complex (SnOPc), and a phthalocyanine titanium oxide complex (TiOPc) is preferable because a metal-oxygen double bond is likely to act on another molecular in terms of a molecular structure and an acceptor property is high.

Note that as the phthalocyanine-based materials described above, a phthalocyanine-based material having a phenoxy group is preferable. Specifically, a phthalocyanine derivative having a phenoxy group, such as PhO-VOPc, is preferable. The phthalocyanine derivative having a phenoxy group is soluble in a solvent; thus, the phthalocyanine derivative has an advantage of being easily handled during formation of a light-emitting element and an advantage of facilitating maintenance of an apparatus used for film formation.

The electron-relay layer 707 may further contain a donor substance. As the donor substance, an organic compound such as tetrathianaphthacene (abbreviation: TTN), nickelocene, or decamethylnickelocene can be used as well as an alkali metal, an alkaline earth metal, a rare earth metal, and a compound of the above metal (e.g., alkali metal compound (including an oxide such as lithium oxide, a halide, and a carbonate such as lithium carbonate or cesium carbonate), an alkaline earth metal compound (including an oxide, a halide, and carbonate), and a rare earth metal compound (including an oxide, a halide, and carbonate)). When such a donor substance is contained in the electron-relay layer 707, electrons can be transferred easily and the light-emitting element can be driven at lower voltage.

In the case where a donor substance is contained in the electron-relay layer 707, in addition to the materials described above as the substance having a high electron-transport property, a substance having a LUMO level greater than the acceptor level of the acceptor substance contained in the composite material layer 708 can be used. As a specific energy level, a LUMO level is greater than or equal to −5.0 eV, preferably greater than or equal to −5.0 eV and less than or equal to −3.0 eV. As examples of such a substance, a perylene derivative and a nitrogen-containing condensed aromatic compound can be given. Note that a nitrogen-containing condensed aromatic compound is preferably used for the electron-relay layer 707 because of its stability.

As specific examples of the perylene derivative, the following can be given: 3,4,9,10-perylenetetracarboxylicdianhydride (abbreviation: PTCDA), 3,4,9,10-perylenetetracarboxylic-bis-benzimidazole (abbreviation: PTCBI), N,N'-dioctyl-3,4,9,10-perylenetetracarboxylic diimide (abbreviation: PTCDI-C8H), N,N'-dihexyl-3,4,9,10-perylenetetracarboxylic diimide (Hex PTC), and the like.

As specific examples of the nitrogen-containing condensed aromatic compound, the following can be given: pirazino[2,3-f][1,10]phenanthroline-2,3-dicarbonitrile (PPDN), 2,3,6,7,10,11-hexacyano-1,4,5,8,9,12-hexaazatriphenylene (HAT(CN)$_6$), 2,3-diphenylpyrido[2,3-b]pyrazine (2PYPR), 2,3-bis(4-fluorophenyl)pyrido[2,3-b]pyrazine (F2PYPR), and the like.

Besides, 7,7,8,8-tetracyanoquinodimethane (abbreviation: TCNQ), 1,4,5,8-naphthalenetetracarboxylicdianhydride (abbreviation: NTCDA), perfluoropentacene, copper hexadecafluoro phthalocyanine (abbreviation: F$_{16}$CuPc), N,N'-bis(2,2,3,3,4,4,5,5,6,6,7,7,8,8,8-pentadecafluorooctyl-1,4,5,8-naphthalenetetracarboxylic diimide (abbreviation: NTCDI-C8F), 3',4'-dibutyl-5,5''-bis(dicyanomethylene)-5,5''- dihydro-2,2':5',2''-terthiophen (abbreviation: DCMT), a methanofullerene (e.g., [6,6]-phenyl C$_{61}$ butyric acid methyl ester), or the like can be used.

Note that in the case where a donor substance is contained in the electron-relay layer 707, the electron-relay layer 707 may be formed by a method such as co-evaporation of the substance having a high electron-transport property and the donor substance.

The hole-injection layer 701, the hole-transport layer 702, the light-emitting layer 703, and the electron-transport layer 704 may each be formed using any of the above-described materials.

Next, a second electrode 405 is formed over the EL layer 403.

The second electrode 405 is provided on the side opposite to the side from which light is extracted and is formed using a reflective material. As the reflective material, a metal material such as aluminum, gold, platinum, silver, nickel, tungsten, chromium, molybdenum, iron, cobalt, copper, or palladium can be used. Besides, an alloy containing aluminum (an aluminum alloy) such as an alloy of aluminum and titanium, an alloy of aluminum and nickel, or an alloy of aluminum and neodymium, or an alloy containing silver such as an alloy of silver and copper can be used. The alloy of silver and copper is preferable because it has high heat resistance. Further, by stacking a metal film or a metal oxide film in contact with the aluminum alloy film, oxidation of the aluminum alloy film can be suppressed. Examples of a material for the metal film and the metal oxide film include titanium, titanium oxide, and the like. The above materials are preferable because they are present in large amounts in the Earth's crust and inexpensive to achieve a reduction in the cost of manufacturing a light-emitting element.

In the above manner, the solid light-emitting element of this embodiment can be fabricated.

Note that this embodiment can be combined with any of the other embodiments in this specification as appropriate.

Embodiment 3

In this embodiment, examples of a lighting device including a light-emitting device which is one embodiment of the present invention are described with reference to FIGS. 7A and 7B.

Figure 7A:
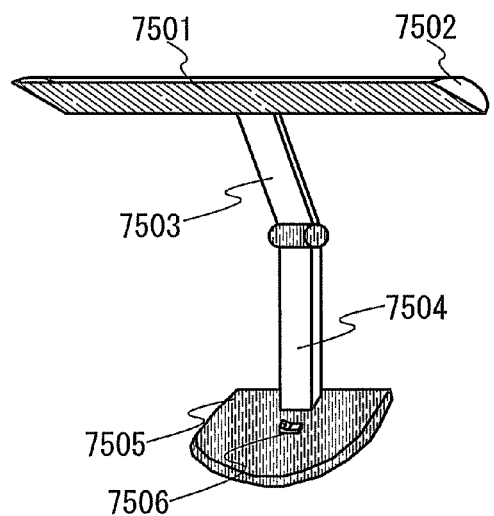
FIGS. 7A and 7B illustrate lighting devices each of which is one embodiment of the present invention.

FIG. 7A illustrates a lighting device (desk lamp), which includes a lighting portion 7501, a shade 7502, an adjustable arm 7503, a support 7504, a base 7505, and a power switch 7506. Note that the lighting device is manufactured by using a light-emitting device, which is manufactured according to one embodiment of the present invention, for the lighting portion 7501. Note that the term "lighting device" also encompasses ceiling lights (ceiling-fixed lighting devices), wall lights (wall-hanging lighting devices), and the like, as well as the desk lamp illustrated in FIG. 7A.

Note that by using the light-emitting device to which one embodiment of the present invention is applied for the lighting portion 7501 of the lighting device (desk lamp), the lighting device (desk lamp) which has high power efficiency and light-extraction efficiency and emits light uniformly in a plane can be provided.

Figure 7B:
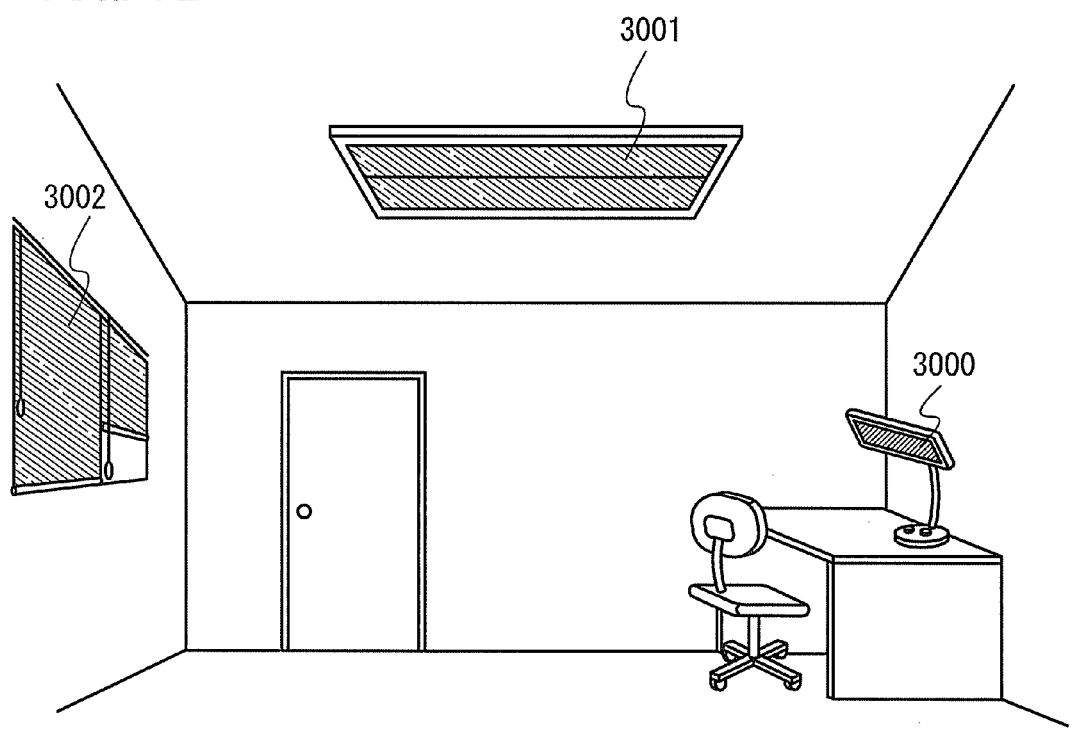

FIG. 7B shows examples in each of which a light-emitting device to which one embodiment of the present invention is applied is used for an interior lighting device. The light-emitting device which is one embodiment of the present invention is advantageous in increasing the area, and thus can be used as a lighting device having a large area as illustrated by a ceiling light 3001. In addition, the light-emitting device can be used for a wall-hanging lighting device 3002. Note that by using the light-emitting device to which one embodiment of the present invention is applied, a lighting device which has high power efficiency and high light-extraction efficiency and emits light uniformly in a plane can be provided. As illustrated in FIG. 7B, a desk lamp 3000 illustrated in FIG. 7A may be used together in a room provided with the interior lighting device.

Example 1

Figure 9:
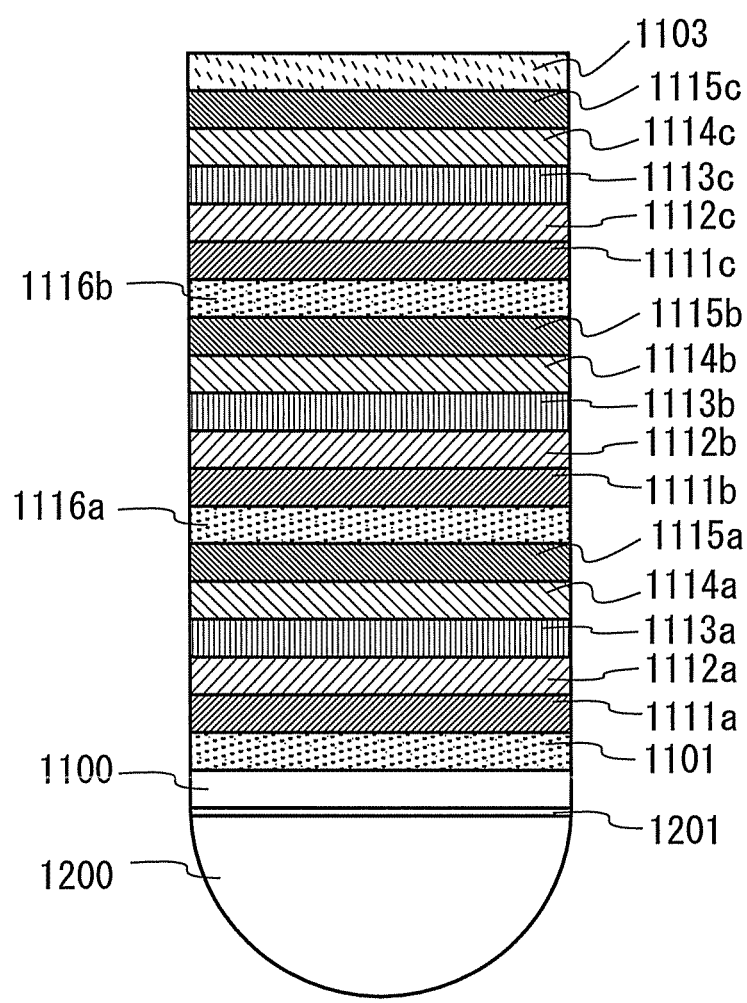
FIG. 9 illustrates a light-emitting device of Example 1.

In Example 1, a light-emitting device which is one embodiment of the present invention is described with reference to FIG. 9. Chemical formulas of materials used in this example are shown below.

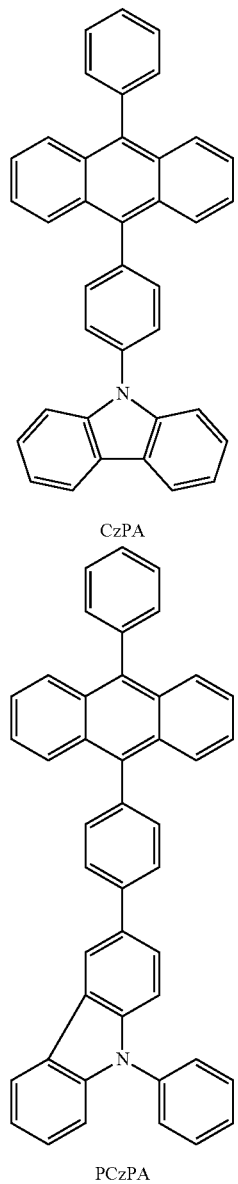

CzPA

PCzPA

-continued

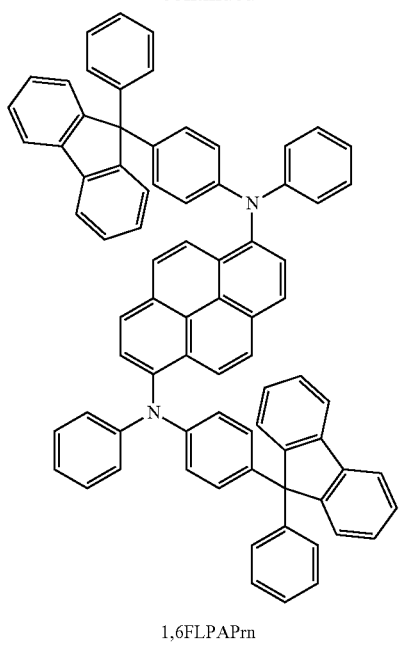

1,6FLPAPrn

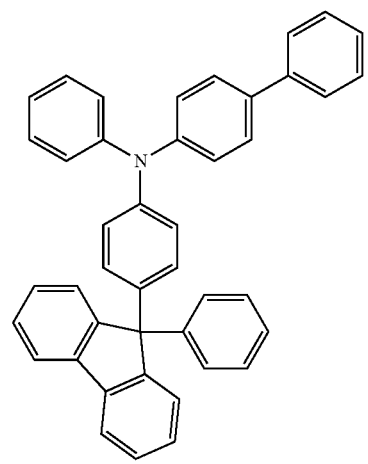

BPAFLP

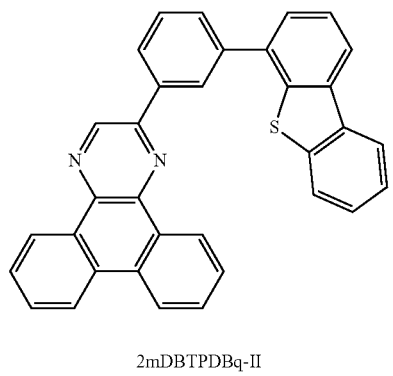

2mDBTPDBq-II

-continued

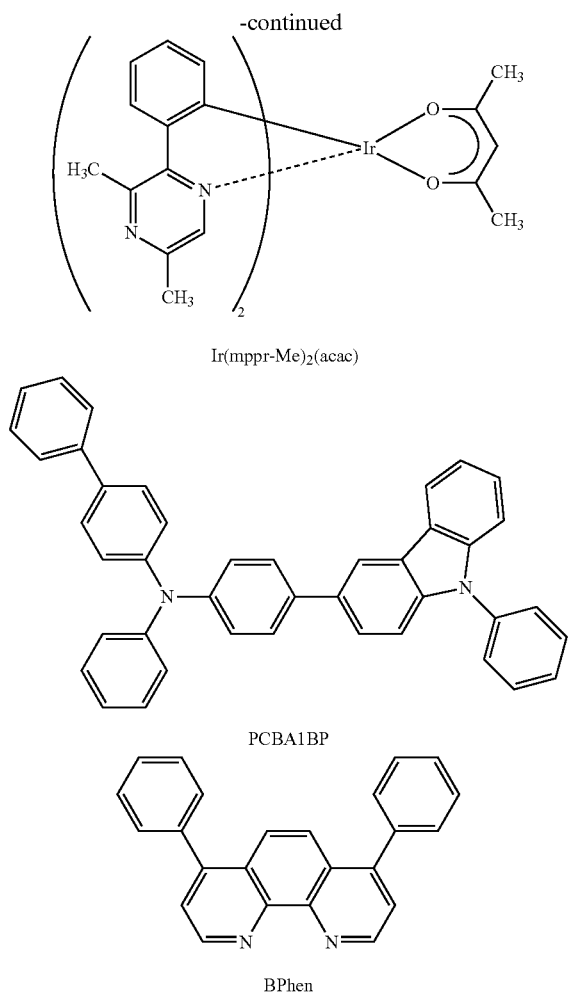

Ir(mppr-Me)₂(acac)

PCBA1BP

BPhen

A method for fabricating the light-emitting device of this example is described below.

First, over one surface of a high refractive index substrate 1100, a light-emitting element was fabricated. As the high refractive index substrate 1100, a glass substrate having a refractive index of 1.806 (S-LAH53 produced by Ohara Inc.) was used.

Then, indium tin oxide containing silicon oxide (ITSO) was deposited by a sputtering method, whereby a first electrode 1101 functioning as an anode was formed. The thickness thereof was 110 nm and the electrode area was 2 mm×2 mm.

As pretreatment for forming the light-emitting element on the substrate 1100, after washing of a surface of the substrate with water, UV ozone treatment was performed for 370 seconds.

After that, the substrate 1100 was transferred into a vacuum evaporation apparatus where the pressure had been reduced to approximately $10^{-4}$ Pa, and subjected to vacuum baking at 150° C. for 1 hour in a heating chamber of the vacuum evaporation apparatus, and then the substrate 1100 was cooled down for about 30 minutes.

Next, the substrate 1100 on which the first electrode 1101 was formed was fixed to a substrate holder in a vacuum evaporation apparatus such that a surface of the substrate 1100 on which the first electrode 1101 was formed faced downward. The pressure in the vacuum evaporation apparatus was reduced to about $10^{-4}$ Pa. Then, on the first electrode 1101, 9-phenyl-3-[4-(10-phenyl-9-anthryl)phenyl]-9H-carbazole (abbreviation: PCzPA) and molybdenum(VI) oxide were co-evaporated, whereby a first hole-injection layer 1111a was formed. The thickness thereof was 100 nm and the weight ratio of PCzPA to molybdenum(VI) oxide was adjusted to 1:0.5 (=PCzPA:molybdenum(VI) oxide). Note that the co-evaporation method means an evaporation method in which evaporation is carried out from a plurality of evaporation sources at the same time in one treatment chamber.

Next, on the first hole-injection layer 1111a, PCzPA was deposited to a thickness of 30 nm, whereby a first hole-transport layer 1112a was formed.

Further, on the first hole-transport layer 1112a, 9-[4-(N-carbazolyl)]phenyl-10-phenylanthracene (abbreviation: CzPA) and N,N'-bis[4-(9-phenyl-9H-fluoren-9-yl)phenyl]-N,N'-diphenylpyrene-1,6-diamine (abbreviation: 1,6FLPA-Prn) were co-evaporated, whereby a first light-emitting layer 1113a was formed. The thickness thereof was 30 nm and the weight ratio of CzPA to 1,6FLPAPm was adjusted to 1:0.05 (=CzPA:1,6FLPAPrn).

Next, on the first light-emitting layer 1113a, CzPA was deposited to a thickness of 5 nm and bathophenanthroline (abbreviation: BPhen) was deposited to a thickness of 15 nm, whereby a first electron-transport layer 1114a was formed.

Further, on the first electron-transport layer 1114a, Li was evaporated to a thickness of 0.1 nm, whereby a first electron-injection layer 1115a was formed.

Next, on the first electron-injection layer 1115a, copper phthalocyanine (abbreviation: CuPc) was evaporated to a thickness of 2 nm, whereby a first intermediate layer 1116a was formed.

Next, on the first intermediate layer 1116a, PCzPA and molybdenum(VI) oxide were co-evaporated, whereby a second hole-injection layer 1111b was formed. The thickness thereof was 20 nm and the weight ratio of PCzPA to molybdenum(VI) oxide was adjusted to 1:0.5 (=PCzPA:molybdenum oxide). Note that the second hole-injection layer 1111b in this example functions as the charge generation layer described in the above embodiment.

Next, on the second hole-injection layer 1111b, 4-phenyl-4'-(9-phenylfluoren-9-yl)triphenylamine (abbreviation: BPAFLP) was deposited to a thickness of 20 nm, whereby a second hole-transport layer 1112b was formed.

Further, on the second hole-transport layer 1112b, 2-[3-(dibenzothiophen-4-yl)phenyl]dibenzo[f,h]quinoxaline (abbreviation: 2mDBTPDBq-II), 4-phenyl-4'-(9-phenyl-9H-carbazol-3-yl)triphenylamine (abbreviation: PCBA1BP), and (acetylacetonato)bis(3,5-dimethyl-2-phenylpyrazinato)iridium(III) (abbreviation: Ir(mppr-Me)₂(acac)) were co-evaporated, whereby a first layer of a second light-emitting layer 1113b was formed. The thickness thereof was 15 nm and the weight ratio of 2mDBTPDBq-II to PCBA1BP and Ir(mppr-Me)₂(acac) was adjusted to 1:0.33:0.1 (=2mDBTPDBq-II:PCBA1BP:Ir(mppr-Me)₂(acac)). Next, on the first layer, 2mDBTPDBq-II and Ir(mppr-Me)₂(acac) were co-evaporated, whereby a second layer was formed. The thickness thereof was 15 nm and the weight ratio of 2mDBTPDBq-II to Ir(mppr-Me)₂(acac) was adjusted to 1:0.06 (=2mDBTPDBq-II:Ir(mppr-Me)₂(acac)).

Next, on the second light-emitting layer 1113b, 2mDBTPDBq-II was deposited to a thickness of 25 nm and Bphen was deposited to a thickness of 15 nm, whereby a second electron-transport layer 1114b was formed.

Further, on the second electron-transport layer 1114b, Li was evaporated to a thickness of 0.1 nm, whereby a second electron-injection layer 1115b was formed.

After that, on the second electron-injection layer 1115b, CuPc was evaporated to a thickness of 2 nm, whereby a second intermediate layer 1116b was formed.

Next, on the second intermediate layer 1116b, PCzPA and molybdenum(VI) oxide were co-evaporated, whereby a third hole-injection layer 1111c was formed. The thickness thereof was 140 nm and the weight ratio of PCzPA to molybdenum (VI) oxide was adjusted to 1:0.5 (=PCzPA:molybdenum oxide). Note that the third hole-injection layer 1111c in this example functions as the charge generation layer described in the above embodiment.

Next, on the third hole-injection layer 1111c, BPAFLP was deposited to a thickness of 20 nm, whereby a third hole-transport layer 1112c was formed.

Then, on the third hole-transport layer 1112c, a third light-emitting layer 1113c and a third electron-transport layer 1114c were formed in this order. The third light-emitting layer 1113c and the third electron-transport layer 1114c were formed with the use of the same structure as the second light-emitting layer 1113b and the second electron-transport layer 1114b, respectively.

Next, on the third electron-transport layer 1114c, lithium fluoride (LiF) was evaporated to a thickness of 0.1 nm, whereby a third electron-injection layer 1115c was formed.

Lastly, on the third electron-injection layer 1115c, aluminum was evaporated to a thickness of 200 nm as a second electrode 1103 functioning as a cathode. Thus, the light-emitting element of this example was fabricated. Light emitted from the light-emitting element can be extracted to air through the first electrode 1101 and the high refractive index substrate 1100.

Note that, in the above evaporation process, evaporation was all performed by a resistance heating method.

The element structure of the light-emitting element fabricated as described above is shown in Table 1.

The light-emitting element was sealed in a glove box under a nitrogen atmosphere so as not to be subjected to air. After that, at a position that is on a side of the substrate 1100 on which the light-emitting element was not formed, and that overlaps with a light-emitting region of the light-emitting element, a high refractive index component 1200 having a light-transmitting property was provided to form the light-emitting device. Note that the high refractive index component 1200 was formed using a glass substrate having a refractive index of 2.003 (S-LAH79 produced by Edmund Optics Inc.) and has a hemispherical shape with a diameter of 1 cm. In addition, a cross-section of the hemisphere is connected to the high refractive index substrate 1100 via a catalytic liquid (a refractive index liquid) that contains sulfur and methylene iodide and has a refractive index of 1.78 (produced by Shimazu Device Corporation) (see a high refractive index liquid layer 1201 in FIG. 9).

Power efficiency of the thus obtained light-emitting device was measured with the use of an integrating sphere. When a current density of 5.2 mA/cm$^2$ (current was 0.2 mA) was supplied to the solid light-emitting element, it emitted light with a power efficiency of 88.4 lm/W (Lumen per Watt).

Figure 8:
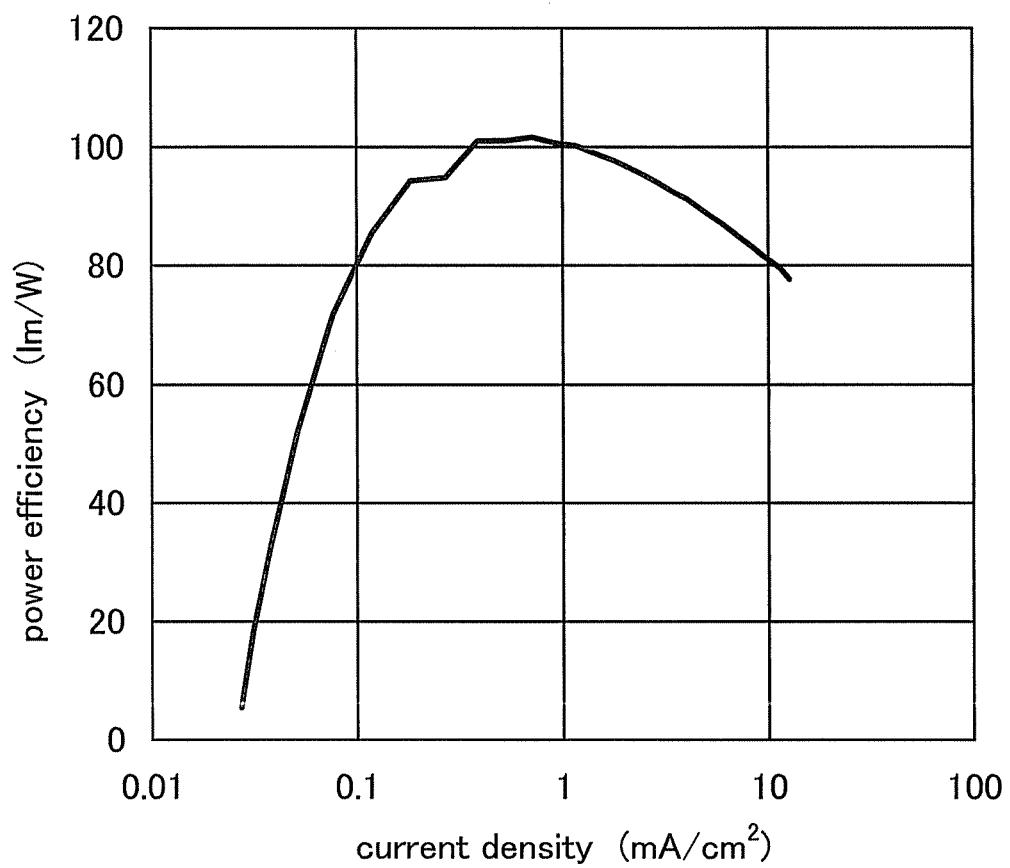
FIG. 8 shows current density vs. power efficiency characteristics of a light-emitting device of Example 1.

In addition, current density vs. power efficiency characteristics of the light-emitting device shown in FIG. 8 indicate that by supplying current with a current density of 0.93 mA/cm$^2$, the light-emitting device can obtain a power efficiency of 101 lm/W. In FIG. 8, the vertical axis represents power efficiency (lm/W), and the horizontal axis represents current density (mA/cm$^2$).

Note that the current density (mA/cm$^2$) vs. power efficiency (lm/W) characteristics of the light-emitting device were calculated from current density (mA/cm$^2$) vs. current efficiency (cd/A) characteristics in the following manner.

Light emitted by a light-emitting region with a size of 2 mm×2 mm of the solid light-emitting element was observed,

TABLE 1

| First Electrode ITSO 110 nm | | | | | | | |
|---|---|---|---|---|---|---|---|
| First Hole-Injection Layer | First Hole-Transport Layer | First Light-Emitting Layer | | First Electron-Transport Layer | | First Electron-Injection Layer | First Intermediate Layer |
| PCzPA:MoOx (=1:0.5) 100 nm | PCzPA 30 nm | CzPA:1,6FLPAPrn (=1:0.05) 30 nm | | CzPA 5 nm | BPhen 15 nm | Li 0.1 nm | CuPc 2 nm |
| Second Hole-Injection Layer | Second Hole-Transport Layer | Second Light-Emitting Layer | | Second Electron-Transport Layer | | Second Electron-Injection Layer | Second Intermediate Layer |
| PCzPA:MoOx (=1:0.5) 20 nm | BPAFLP 20 nm | 2mDBTPDBq-II: PCBA1BP: Ir(mppr-Me)$_2$ (acac) (=1:0.33:0.1) 15 nm | 2mDBTPDBq-II: Ir(mppr-Me)$_2$ (acac) (=1:0.06) 15 nm | 2mDBT PDBq-II 25 nm | BPhen 15 nm | Li 0.1 nm | CuPc 2 nm |
| Third Hole-Injection Layer | Third Hole-Transport Layer | Third Light-Emitting Layer | | Third Electron-Transport Layer | | Third Electron-Injection Layer | Second Electrode |
| PCzPA:MoOx (=1:0.5) 140 nm | BPAFLP 20 nm | 2mDBTPDBq-II: PCBA1BP: Ir(mppr-Me)$_2$ (acac) (=1:0.33:0.1) 15 nm | 2mDBTPDBq-II: Ir(mppr-Me)$_2$ (acac) (=1:0.06) 15 nm | 2mDBT PDBq-II 25 nm | BPhen 15 nm | LiF 0.1 nm | Al 200 nm | not through a hemispherical structural body, but through the high refractive index substrate from the vertical direction to the high refractive index substrate, and a driving voltage and the current density (mA/cm$^2$) vs. current efficiency (cd/A) characteristics were measured.

Here, it was assumed that the current density of the solid light-emitting element controlled emission intensity of the solid light-emitting element, but did not affect spatial distribution of light emitted from the solid light-emitting element. Further, when a value that is obtained by dividing the current efficiency (cd/A) by the driving voltage (V) is defined, the power efficiency (lm/W) is in proportion to the value obtained by dividing the current efficiency (cd/A) by the driving voltage (V). Accordingly, when the value obtained by dividing the current efficiency (cd/A) by the driving voltage (V) is multiplied by a proportionality constant, the current density (mA/cm$^2$) vs. power efficiency (lm/W) characteristics can be obtained.

Note that the proportionality constant can be obtained in the following manner. In the first step, the current density and the luminance of the solid light-emitting element at a specific driving voltage $E_1$(V) were measured, the current efficiency $\Phi_1$ (cd/A) was calculated, and the value $\Phi_1/E_1$ was obtained by dividing the current efficiency $\Phi_1$(cd/A) by the driving voltage $E_1$ (V). In the second step, a hemispherical structural body was provided over the high refractive index substrate via a buffer solution at a position that overlaps with the light-emitting region of the same solid light-emitting element, whereby the light-emitting device was formed. In the third step, the driving voltage $E_1$ (V) was applied to the light-emitting device, and power efficiency $P_1$ (lm/W) was measured with the use of the integrating sphere. In the fourth step, $P_1$ was divided by ($\Phi_1/E_1$), whereby the proportionality constant C was obtained. In this example, the proportionality constant was 8.39 (=88.4 (lm/W)÷{96.9 (cd/A)÷9.2 (V)}).

Reference Example

A method for synthesizing 2-[3-(dibenzothiophen-4-yl)phenyl]dibenzo[f,h]quinoxaline (abbreviation: 2mDBTP-DBq-II) used in the above example is described.

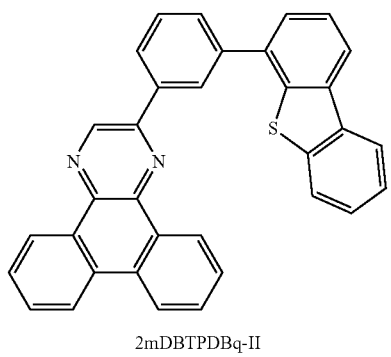 [SMILES: c1cc(-c2cnc3c4ccccc4c4ccccc4c3n2)cc(-c2cccc3c2sc2ccccc23)c1]

2mDBTPDBq-II

A scheme for the synthesis of 2mDBTPDBq-II is illustrated in (A-1).

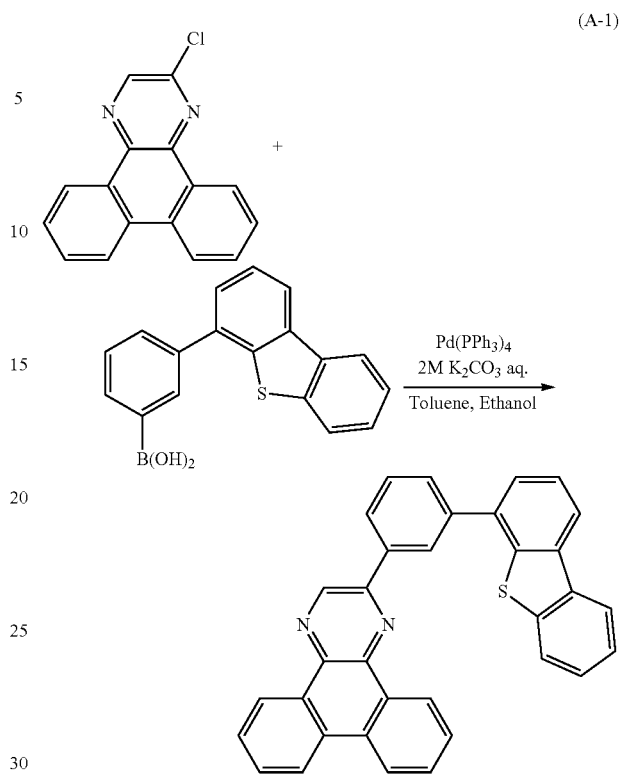

(A-1)

In a 2 L three-neck flask were put 5.3 g (20 mmol) of 2-chlorodibenzo[f,h]quinoxaline, 6.1 g (20 mmol) of 3-(dibenzothiophen-4-yl)phenylboronic acid, 460 mg (0.4 mmol) of tetrakis(triphenylphosphine)palladium(0), 300 mL of toluene, 20 mL of ethanol, and 20 mL of a 2M aqueous potassium carbonate solution. The mixture was degassed by being stirred under reduced pressure, and the atmosphere in the flask was replaced with nitrogen. This mixture was stirred under a nitrogen stream at 100° C. for 7.5 hours. After cooled to room temperature, the obtained mixture was filtered to give a white substance. The substance was washed with water and ethanol in this order, and then dried. The obtained solid was dissolved in about 600 mL of hot toluene, followed by suction filtration through Celite (produced by Wako Pure Chemical Industries, Ltd., Catalog No. 531-16855) and Florisil (produced by Wako Pure Chemical Industries, Ltd., Catalog No. 540-00135), whereby a clear colorless filtrate was obtained. The obtained filtrate was concentrated and purified by silica gel column chromatography. The chromatography was carried out using hot toluene as a developing solvent. Acetone and ethanol were added to the solid obtained here, followed by irradiation with ultrasonic waves. Then, the generated suspended solid was filtered and the obtained solid was dried to give 7.85 g of a white powder in 80% yield.

By a train sublimation method, 4.0 g of the obtained white powder was purified. In the purification, the white powder was heated at 300° C. under a pressure of 5.0 Pa with a flow rate of argon gas of 5 mL/min. After the purification, 3.5 g of a white powder was obtained in 88% yield, which was the objective substance of this synthesis.

A nuclear magnetic resonance (NMR) method identified this compound as 2-[3-(dibenzothiophen-4-yl)phenyl]dibenzo[f,h]quinoxaline (abbreviation: 2mDBTPDBq-II), which was the objective substance of this synthesis.

¹H NMR data of the obtained substance are as follows:
¹H NMR (CDCl$_3$, 300 MHz): δ (ppm)=7.45-7.52 (m, 2H), 7.59-7.65 (m, 2H), 7.71-7.91 (m, 7H), 8.20-8.25 (m, 2H), 8.41 (d, J=7.8 Hz, 1H), 8.65 (d, J=7.5 Hz, 2H), 8.77-8.78 (m, 1H), 9.23 (dd, J=7.2 Hz, 1.5 Hz, 1H), 9.42 (dd, J=7.8 Hz, 1.5 Hz, 1H), 9.48 (s, 1H).

This application is based on Japanese Patent Application serial no. 2010-206386 filed with Japan Patent Office on Sep. 15, 2010, the entire contents of which are hereby incorporated by reference.

What is claimed is:

1. A light-emitting device comprising:
a substrate having a refractive index of 1.6 or higher and a light-transmitting property;
a solid light-emitting element including a light-emitting region having a refractive index of 1.6 or higher on one surface of the substrate;
a component having a refractive index of 1.6 or higher and a light-transmitting property on the other surface of the substrate; and
a layer having a refractive index of 1.6 or higher and a light-transmitting property,
wherein the component includes an uneven structure on a surface in contact with an air and overlaps with the substrate via the layer, and
wherein the layer overlaps with the light-emitting region.

2. The light-emitting device according to claim 1,
wherein the solid light-emitting element includes the light-emitting region interposed between a first electrode that is formed over the substrate and has a refractive index of 1.6 or higher and a light-transmitting property and a second electrode overlapping with the first electrode, and
wherein the light-emitting region includes a light-emitting layer containing a light-emitting organic compound.

3. The light-emitting device according to claim 1, wherein the solid light-emitting element is a light-emitting diode.

4. A lighting device comprising the light-emitting device according to claim 1 in a light-emitting portion.

5. The light-emitting device according to claim 1, wherein the layer has fluidity.

6. The light-emitting device according to claim 1, wherein the layer is a liquid having fluidity.

7. The light-emitting device according to claim 1, wherein the layer includes a catalytic liquid.

8. A light-emitting device comprising:
a substrate having a refractive index of 1.6 or higher and a light-transmitting property;
a solid light-emitting element including a light-emitting region having a refractive index of 1.6 or higher on one surface of the substrate;
a layer having a refractive index of 1.6 or higher and a light-transmitting property; and
a hemispherical component having a refractive index of 1.6 or higher and a light-transmitting property on the other surface of the substrate,
wherein the component overlaps with the substrate via the layer, and
wherein the layer overlaps with the light-emitting region.

9. The light-emitting device according to claim 8,
wherein the solid light-emitting element includes the light-emitting region interposed between a first electrode that is formed over the substrate and has a refractive index of 1.6 or higher and a light-transmitting property and a second electrode overlapping with the first electrode, and
wherein the light-emitting region includes a light-emitting layer containing a light-emitting organic compound.

10. The light-emitting device according to claim 8, wherein the solid light-emitting element is a light-emitting diode.

11. A lighting device comprising the light-emitting device according to claim 8 in a light-emitting portion.

12. The light-emitting device according to claim 8, wherein the layer has fluidity.

13. The light-emitting device according to claim 8, wherein the layer is a liquid having fluidity.

14. The light-emitting device according to claim 8, wherein the layer includes a catalytic liquid.

* * * * *